United States Patent
Kim et al.

(10) Patent No.: US 10,446,070 B2
(45) Date of Patent: Oct. 15, 2019

(54) DISPLAY DEVICE, SCAN DRIVER, AND METHOD OF MANUFACTURING THE SAME

(71) Applicant: LG Display Co., Ltd., Seoul (KR)

(72) Inventors: Jiah Kim, Gyeonggi-do (KR); Juyoung Lee, Gyeonggi-do (KR); Byeongseong So, Gyeonggi-do (KR); Seungjun Lee, Seoul (KR)

(73) Assignees: LG Display Co., Ltd., Seoul (KR); Ewha University—Industry Collaboration Foundation, Seoul (KR)

(*) Notice: Subject to any disclaimer, the term of this patent is extended or adjusted under 35 U.S.C. 154(b) by 220 days.

(21) Appl. No.: 14/818,761

(22) Filed: Aug. 5, 2015

(65) Prior Publication Data
US 2016/0042684 A1 Feb. 11, 2016

(30) Foreign Application Priority Data
Aug. 6, 2014 (KR) .................. 10-2014-0101324

(51) Int. Cl.
*G09G 3/20* (2006.01)
*G09G 3/3266* (2016.01)
(Continued)

(52) U.S. Cl.
CPC ............. *G09G 3/20* (2013.01); *G09G 3/3266* (2013.01); *G09G 3/3674* (2013.01); *G11C 19/28* (2013.01);
(Continued)

(58) Field of Classification Search
CPC ......... G09G 2330/02; G09G 2330/021; G09G 2330/022; G09G 2330/023;
(Continued)

(56) References Cited

U.S. PATENT DOCUMENTS

| | | | | |
|---|---|---|---|---|
| 4,568,843 A | * | 2/1986 | Gloanec | H03K 3/356069 327/202 |
| 4,939,384 A | * | 7/1990 | Shikata | H03K 3/037 327/212 |

(Continued)

FOREIGN PATENT DOCUMENTS

| CN | 1256480 A | 6/2000 |
|---|---|---|
| CN | 1503215 A | 6/2004 |

(Continued)

OTHER PUBLICATIONS

Office Action dated Jul. 4, 2017, issued in corresponding Chinese Application No. 201510475778.2.
(Continued)

*Primary Examiner* — Grant Sitta
(74) *Attorney, Agent, or Firm* — Morgan, Lewis & Bockius LLP

(57) ABSTRACT

Provided are a display device, a scan driver, and a method of manufacturing the same. A scan driver includes: a level shifter configured to output a power and a signal, and a scan signal generating circuit configured to generate a scan signal based on the power and the signal supplied from the level shifter, the scan signal generating circuit including a buffer configured to transmit a clock signal to a stage of a shift register, the buffer including two inverters, one of the two inverters being included in a multi-buffer.

19 Claims, 20 Drawing Sheets

(51) Int. Cl.
*G09G 3/36* (2006.01)
*G11C 19/28* (2006.01)

(52) U.S. Cl.
CPC ............... *G09G 2310/0267* (2013.01); *G09G 2310/0286* (2013.01); *G09G 2310/0289* (2013.01); *G09G 2310/08* (2013.01); *G09G 2320/0223* (2013.01)

(58) Field of Classification Search
CPC ..... G09G 2330/024; G09G 2310/0286; G09G 3/3685; G09G 3/3688; G09G 3/3692; G09G 3/20; G09G 3/3266; G09G 3/3674; G09G 2310/0267; G09G 2310/0289; G09G 2310/08; G09G 2320/0223; G11C 19/28
USPC .................................................. 345/212, 100
See application file for complete search history.

(56) References Cited

U.S. PATENT DOCUMENTS

| | | | | |
|---|---|---|---|---|
| 6,256,025 | B1* | 7/2001 | Imai | G09G 3/3696 345/210 |
| 6,373,458 | B1* | 4/2002 | Yamakura | G09G 3/3648 345/100 |
| 6,388,652 | B1* | 5/2002 | Yamazaki | G02F 1/13452 345/98 |
| 7,102,611 | B2* | 9/2006 | Chung | G09G 3/3611 345/100 |
| 8,159,444 | B2* | 4/2012 | Go | G09G 3/3677 345/100 |
| 8,952,948 | B2* | 2/2015 | Moon | G09G 3/3648 345/208 |
| 9,190,169 | B2* | 11/2015 | Han | G09G 3/3677 |
| 9,293,094 | B2* | 3/2016 | Morii | G09G 3/3677 |
| 9,318,071 | B2* | 4/2016 | Won | G09G 3/3677 |
| 9,384,705 | B2* | 7/2016 | Ryu | G09G 3/3677 |
| 9,401,105 | B2* | 7/2016 | Cho | G09G 3/20 |
| 9,595,219 | B2* | 3/2017 | Shim | G09G 3/2092 |
| 9,607,565 | B2* | 3/2017 | Lee | G09G 3/3674 |
| 9,666,140 | B2* | 5/2017 | Nakata | G09G 3/2092 |
| 2002/0154110 | A1 | 10/2002 | Anzai et al. | |
| 2003/0174115 | A1* | 9/2003 | Washio | G09G 3/3688 345/98 |
| 2003/0179174 | A1* | 9/2003 | Matsuda | G09G 3/3677 345/100 |
| 2004/0150599 | A1 | 8/2004 | Morita | |
| 2005/0012887 | A1* | 1/2005 | Koyama | G02F 1/13454 349/151 |
| 2005/0057481 | A1* | 3/2005 | Chung | G09G 3/3677 345/100 |
| 2006/0114212 | A1 | 6/2006 | Hirosawa | |
| 2006/0114216 | A1* | 6/2006 | Shim | G09G 3/3677 345/100 |
| 2007/0229433 | A1* | 10/2007 | Jang | G09G 3/3677 345/96 |
| 2008/0079685 | A1 | 4/2008 | Umezaki et al. | |
| 2008/0136756 | A1* | 6/2008 | Yeo | G09G 3/3677 345/87 |
| 2009/0251454 | A1 | 10/2009 | Jang | |
| 2012/0075279 | A1* | 3/2012 | Ishida | H03K 19/01852 345/211 |
| 2012/0092311 | A1* | 4/2012 | Ohkawa | G09G 3/3655 345/204 |
| 2013/0106478 | A1* | 5/2013 | Moon | H03L 7/0814 327/161 |
| 2013/0148775 | A1* | 6/2013 | Shin | G11C 19/28 377/69 |
| 2013/0314139 | A1* | 11/2013 | Umezaki | G02F 1/13624 327/208 |
| 2014/0091997 | A1* | 4/2014 | Han | G09G 3/3677 345/92 |
| 2014/0091998 | A1* | 4/2014 | Ko | G09G 3/3674 345/100 |
| 2014/0098017 | A1* | 4/2014 | Murakami | G11C 19/28 345/100 |
| 2014/0111495 | A1* | 4/2014 | Iwase | G09G 3/3677 345/211 |
| 2014/0168181 | A1* | 6/2014 | Furuta | G11C 19/28 345/205 |
| 2014/0347404 | A1* | 11/2014 | Lee | G09G 5/18 345/690 |

FOREIGN PATENT DOCUMENTS

| | | |
|---|---|---|
| CN | 1790451 A | 6/2006 |
| CN | 101154343 A | 4/2008 |
| CN | 101551968 A | 10/2009 |

OTHER PUBLICATIONS

Office Action dated Mar. 2, 2018, issued in corresponding Chinese Application No. 201510475778.2.

* cited by examiner (Related Art)

DISPLAY DEVICE, SCAN DRIVER, AND METHOD OF MANUFACTURING THE SAME

CROSS-REFERENCE TO RELATED APPLICATION(S)

This application claims the benefit of Korean Patent Application No. 10-2014-0101324, filed on Aug. 6, 2014, the entire disclosure of which is hereby incorporated by reference herein for all purposes.

BACKGROUND

1. Technical Field

The present disclosure relates to a display device, a scan driver, and a method of manufacturing the same.

2. Discussion of the Related Art

The development of information technology has expanded the market of display devices used as a connection medium between users and information. Hence, the use of the display devices, such as an organic light-emitting diode (OLED) display, a liquid crystal display (LCD), and a plasma display panel (PDP), is increasing.

Among the above-described display devices, for example, the liquid crystal display or the OLED display includes a display panel including a plurality of subpixels arranged in a matrix form and a driver for driving the display panel. The driver includes a scan driver supplying a scan signal (or a gate signal) to the display panel and a data driver supplying a data signal to the display panel.

When the scan signal and the data signal are supplied to the subpixels of the display device, the selected subpixels emit light, and thus may display an image.

The scan driver outputting the scan signal may be classified into an outer mounted scan driver mounted on an outer substrate of the display panel in an integrated circuit (IC) form and an embedded scan driver formed in the display panel in a gate-in-panel (GIP) form when a thin-film transistor is manufactured. However, when the large-screen display devices having a high resolution are manufactured, various problems may be generated due to circuit characteristics of the related art embedded scan driver. Thus, there is a need to address the problems of the embedded scan driver.

SUMMARY

Accordingly, the present disclosure is directed to a display device, a scan driver, and method of manufacturing the same that substantially obviate one or more of the problems due to limitations and disadvantages of the related art.

Additional features and advantages will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a display device, comprising: a display panel, and a scan driver comprising: a level shifter, and a scan signal generating circuit configured to generate a scan signal to be supplied to the display panel based on a power and a signal supplied from the level shifter, the scan signal generating circuit comprising a buffer configured to transmit a clock signal to a stage of a shift register, the buffer comprising two inverters, one of the two inverters being included in a multi-buffer.

In another aspect, there is provided a scan driver, including: a level shifter configured to output a power and a signal, and a scan signal generating circuit configured to generate a scan signal based on the power and the signal supplied from the level shifter, the scan signal generating circuit including a buffer configured to transmit a clock signal to a stage of a shift register, the buffer including two inverters, one of the two inverters being included in a multi-buffer.

In another aspect, there is provided a method of manufacturing a scan driver, including: providing a level shifter configured to output a power and a signal, and providing a scan signal generating circuit configured to generate a scan signal based on the power and the signal supplied from the level shifter, the scan signal generating circuit including a buffer configured to transmit a clock signal to a stage of a shift register, the buffer including two inverters, one of the two inverters being included in a multi-buffer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
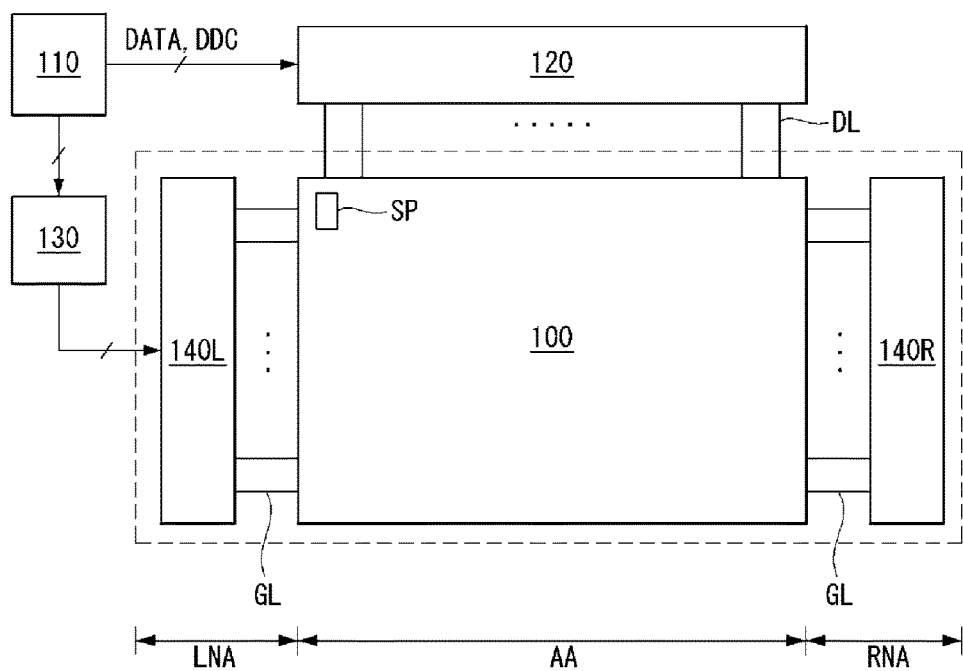
FIG. 1 is a block diagram schematically showing a display device.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Example embodiments will be described with reference to FIGS. 1 to 20.

Figure 2:
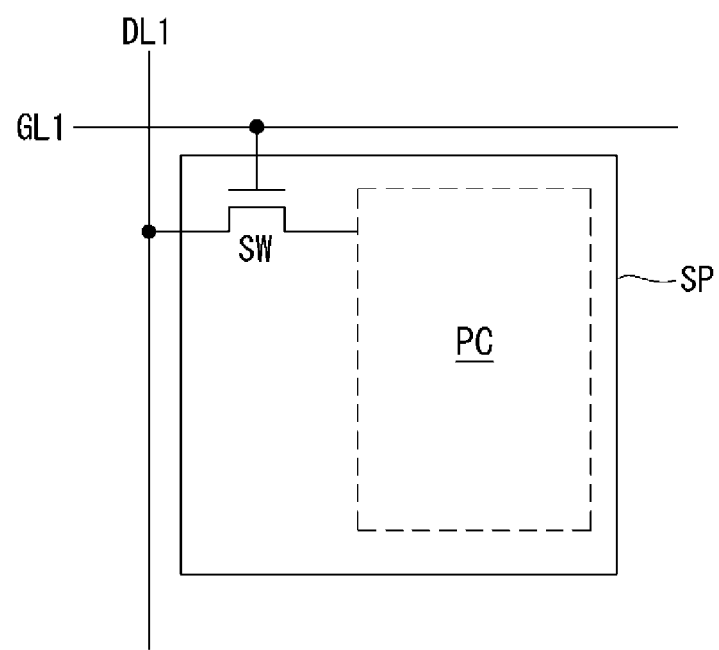
FIG. 2 shows an example of configuration of a subpixel shown in FIG. 1.

FIG. 1 is a block diagram schematically showing a display device. FIG. 2 shows an example of configuration of a subpixel shown in FIG. 1.

As shown in FIG. 1, a display device may include a display panel 100, a timing controller 110, a data driver 120, and scan drivers 130, 140L, and 140R. The display panel 100 may include subpixels dividedly connected to data lines DL and scan lines GL crossing the data lines DL. The display panel 100 may include a display area AA, in which the subpixels are formed, and non-display areas LNA and RNA, positioned outside the display area AA, in which various signal lines or pads may be formed. The display panel 100 may be implemented, e.g., as a liquid crystal display (LCD) panel, an organic light emitting diode (OLED) display panel, an electrophoresis display panel, and the like.

As shown in the FIG. 2 example, one subpixel SP may include a switching transistor SW, connected to a first scan line GL1 and a first data line DL1, and a pixel circuit PC operating in response to a data signal DATA (FIG. 1) that is, itself, supplied in response to a scan signal supplied through the switching transistor SW. The subpixel SP may be included in a liquid crystal display panel including a liquid crystal element, or in an OLED display panel including an organic light emitting element, depending on configuration of the pixel circuit PC.

When the display panel 100 is configured as the liquid crystal display panel, the display panel 100 may be implemented, e.g., in a twisted nematic (TN) mode, a vertical alignment (VA) mode, an in-plane switching (IPS) mode, a fringe field switching (FFS) mode, or an electrically controlled birefringence (ECB) mode. When the display panel 100 is configured as the OLED display panel, the display panel 100 may implemented, e.g., as a top emission type, a bottom emission type, or a dual emission type.

The timing controller 110 may receive timing signals, such as a vertical sync signal, a horizontal sync signal, a data enable signal, and a dot clock, through a low-voltage differential signaling (LVDS) interface receiving circuit or through a transition minimized differential signaling (TMDS) interface receiving circuit connected to an image board. The timing controller 110 may generate timing control signals for controlling operation timings of the data driver 120 and the scan drivers 130, 140L, and 140R based on the received timing signals.

The data driver 120 may include a plurality of source driver integrated circuits (ICs). The source driver ICs may receive the data signal DATA and a source timing control signal DDC from the timing controller 110. The source driver ICs may convert the data signal DATA from a digital signal to an analog signal in response to the source timing control signal DDC, and may supply the analog signal through the data lines DL of the display panel 100. The source driver ICs may be connected to the data lines DL of the display panel 100 by a chip-on-glass (COG) process or by a tape automated bonding (TAB) process.

The scan drivers 130, 140L, and 140R may include a level shifter 130 and scan signal generating circuits 140L and 140R. The scan drivers 130, 140L, and 140R may be formed through a gate-in-panel (GIP) method, in which the level shifter 130 and the scan signal generating circuits 140L and 140R are dividedly formed.

The level shifter 130 may be formed on an external substrate connected to the display panel 100 in an IC form. The level shifter 130 may shift levels of a signal and a power supplied through a clock signal line, a start signal line, a high potential power line, and a low potential power line under the control of the timing controller 110, and then may supply them to shift registers 140L and 140R.

The scan signal generating circuits 140L and 140R may be formed in the form of a thin-film transistor in the non-display areas LNA and RNA of the display panel 100 by the GIP method. The scan signal generating circuits 140L and 140R may be dividedly formed in the non-display areas LNA and RNA of the display panel 100. The scan signal generating circuits 140L and 140R may include stages, which may shift and output the scan signal in response to the signal and the power supplied from the level shifter 130. The stages included in the scan signal generating circuits 140L and 140R may sequentially output the scan signals through their output terminals.

In the embedded scan driver, in which the level shifter 130 and the scan signal generating circuits 140L and 140R may be dividedly formed as described above, the scan signal generating circuits 140L and 140R may be implemented as an oxide thin-film transistor or an amorphous silicon thin-film transistor. The oxide thin-film transistor has some advantages in that shift characteristic of a current is excellent, and its circuit is designed to be smaller than the amorphous silicon thin-film transistor. The amorphous silicon thin-film transistor has some advantages in that its threshold voltage may be uniformly maintained, even if time has passed, and thus recovery characteristic of the threshold voltage depending on a stress bias is better than the oxide thin-film transistor. However, when the display device is implemented as a large-screen display device having a high resolution, there may be a need to address various problems generated due to the circuit characteristics of the embedded scan driver.

Figure 3:
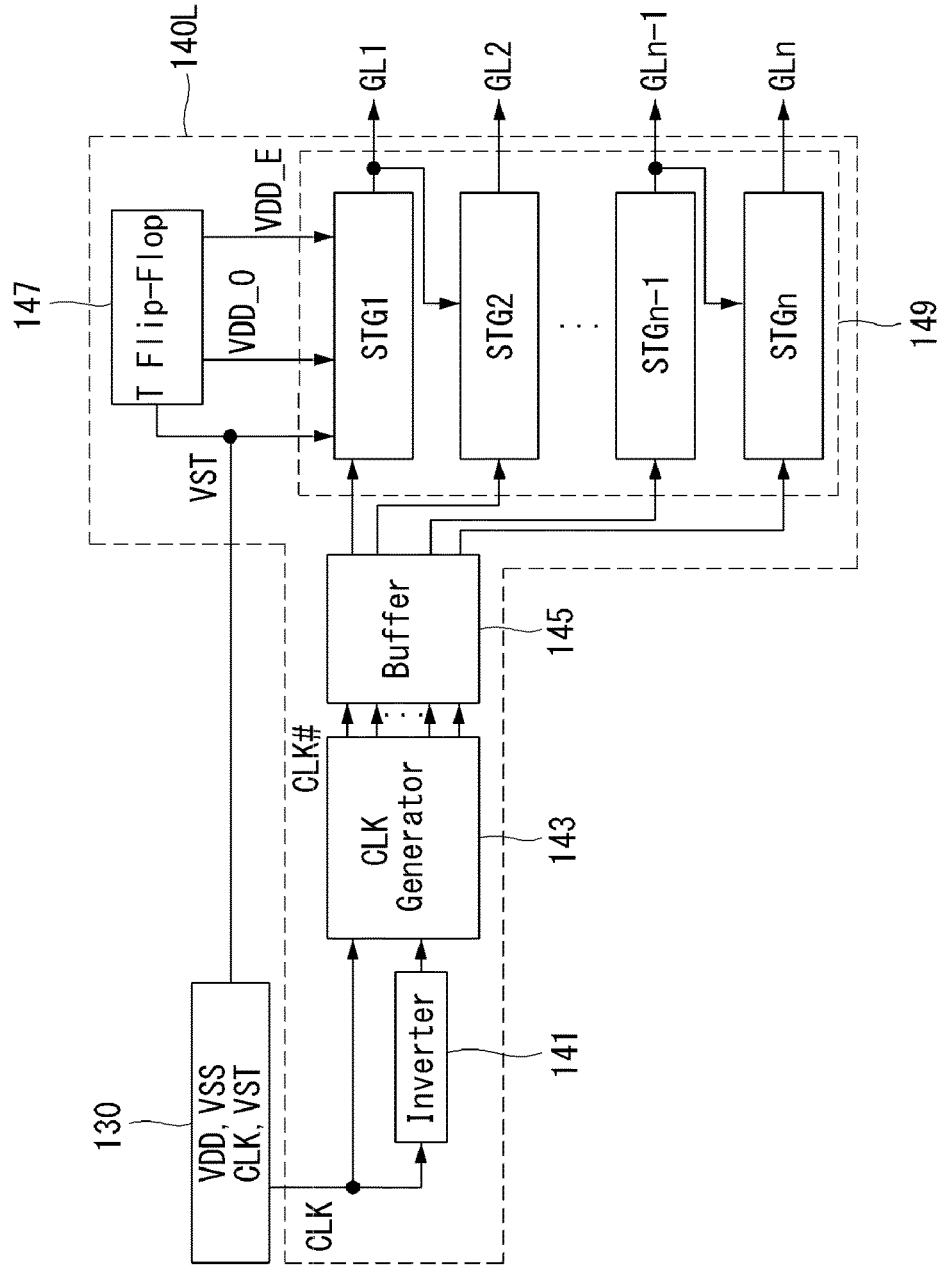
FIG. 3 is a block diagram schematically showing a scan driver according to an embodiment.
Figure 4:
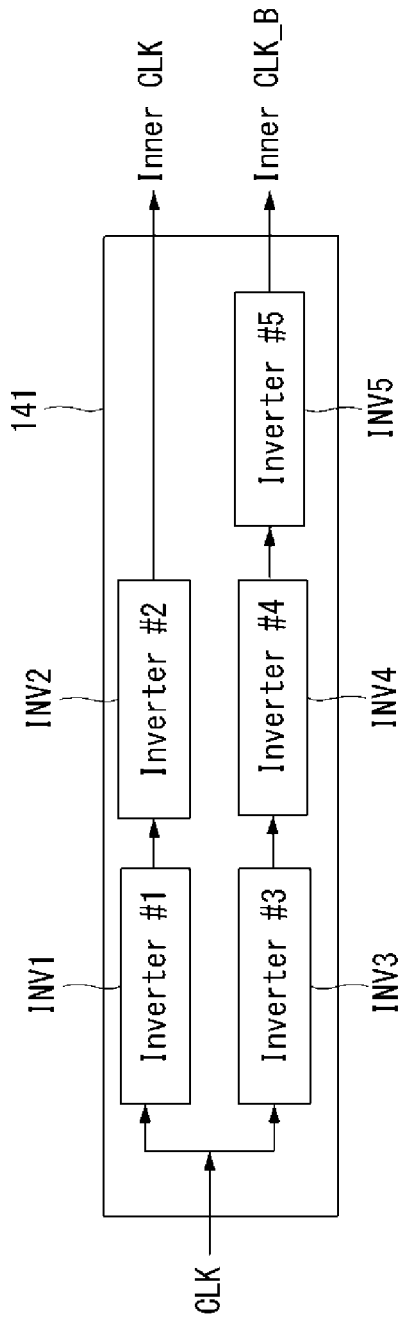
FIG. 4 is a block diagram showing in detail an inverter shown in FIG. 3.
Figure 5:
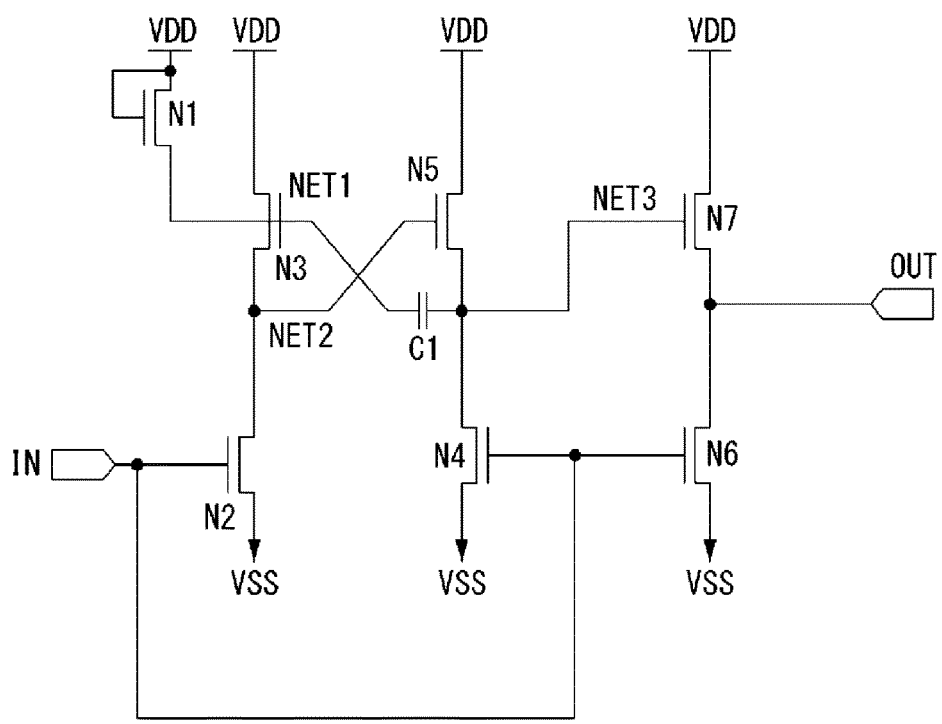
FIG. 5 shows in detail a circuit configuration of an inverter shown in FIG. 4.

FIG. 3 is a block diagram schematically showing the scan driver according to the embodiment of the invention. FIG. 4 is a block diagram showing in detail an inverter shown in FIG. 3. FIG. 5 shows in detail a circuit configuration of an inverter shown in FIG. 4. Hereinafter, embodiments are described in detail using the scan signal generating circuit 140L formed on the left side of the display panel as illustrative examples. Embodiments are not limited thereto.

As shown in the FIG. 3 example, the scan signal generating circuit 140L of the scan driver according to an embodiment may include an inverter 141, a clock signal generating circuit 143, a buffer 145, a power control circuit 147, and a shift register 149. In the scan driver according to an embodiment, the inverter 141, the clock signal generating circuit 143, the buffer 145, the power control circuit 147, and the shift register 149 (except for the level shifter 130) may be formed on the display panel 100. For example, the inverter 141, the clock signal generating circuit 143, the buffer 145, the power control circuit 147, and the shift register 149 may be formed by the GIP method.

The level shifter 130 may generate a clock signal CLK, a start signal VST, a high potential power VDD, and a low potential power VSS, and may output these signals. The clock signal CLK and the start signal VST may be generated at different phases, and may help the shift register 149 to sequentially output the scan signal.

The number of clock signals CLK may vary depending on the configuration of the shift register 149, but there embodiments include at least two clock signals CLK. The start signal VST may be supplied only to a first stage STG1 of the shift register 149, and a first scan signal output through an output terminal of the first stage STG1 may be used as a start signal of a next stage. However, the first scan signal may be used as not a start signal of a next stage, but as a start signal of a stage after the next stage, depending on the configuration of the shift register 149 and a waveform of the clock signal CLK.

The related art level shifter outputs a plurality of clock signals. However, the level shifter 130 according to an embodiment outputs only one clock signal CLK. This reason is because one clock signal CLK is divided by the inverter 141 and the clock signal generating circuit 143, and may be output as a plurality of clock signals.

As shown in the FIG. 4 example, the inverter 141 may include first and second input terminals to which one clock signal CLK is commonly input, a first output terminal which delays the one clock signal CLK and outputs the clock signal CLK as an internal clock signal Inner CLK, and a second output terminal which delays and inverts the one clock signal CLK and outputs the clock signal CLK as an internal inversion clock signal Inner CLK_B.

The inverter 141 may include at least five inverters INV1 to INV5. The first and second inverters INV1 and INV2 may delay one clock signal CLK, and may output the clock signal CLK as an internal clock signal Inner CLK. The one clock signal CLK may go through the first and second inverters INV1 and INV2, and thus may be inverted twice. Hence, the one clock signal CLK may be recovered to be an original signal after the two inversions, delayed, and output.

The third to fifth inverts INV3 to INV5 may delay and invert one clock signal CLK, and may output the clock signal CLK as an internal inversion clock signal Inner CLK_B. The one clock signal CLK may go through the third to fifth inverts INV3 to INV5, and thus may be inverted three times. Hence, the one clock signal CLK may be converted into an inverted signal after the three inversions, delayed, and output.

As shown in FIG. 5, one inverter may include transistors N1 to N7 and a first capacitor C1. For example, each of the first to fifth inverters INV1 to INV5 may have a circuit configuration shown in the FIG. 5 example.

A gate electrode and a first electrode of the N1 transistor N1 may be connected to a high potential power line VDD, and a second electrode of the N1 transistor N1 may be connected to a gate electrode of the N3 transistor N3. A gate electrode of the N2 transistor N2 may be connected to an input terminal IN of the inverter, a first electrode of the N2 transistor N2 may be connected to a second electrode of the N3 transistor N3, and a second electrode of the N2 transistor N2 may be connected to a low potential power line VSS. The gate electrode of the N3 transistor N3 may be connected to the second electrode of the N1 transistor N1, a first electrode of the N3 transistor N3 may be connected to the high potential power line VDD, and the second electrode of the N3 transistor N3 may be connected to the first electrode of the N2 transistor N2. A line connected to the gate electrode of the N3 transistor N3 is defined as a first net NET1.

A gate electrode of the N4 transistor N4 may be connected to the input terminal IN of the inverter, a first electrode of the N4 transistor N4 may be connected to a second electrode of the N5 transistor N5, and a second electrode of the N4 transistor N4 may be connected to the low potential power line VSS. A gate electrode of the N5 transistor N5 may be connected to the second electrode of the N3 transistor N3, a first electrode of the N5 transistor N5 may be connected to the high potential power line VDD, and the second electrode of the N5 transistor N5 may be connected to the first electrode of the N4 transistor N4. A line connected to the gate electrode of the N5 transistor N5 is defined as a second net NET2.

One end of the first capacitor C1 may be connected to the second electrode of the N1 transistor N1 and the gate electrode of the N3 transistor N3, and the other end may be connected to the second electrode of the N5 transistor N5 and a gate electrode of the N7 transistor N7. A gate electrode of the N6 transistor may be is connected to the input terminal IN of the inverter, a first electrode of the N6 transistor N6 may be connected to a second electrode of the N7 transistor N7 and an output terminal OUT of the inverter, and a second electrode of the N6 transistor N6 may be connected to the low potential power line VSS.

The gate electrode of the N7 transistor N7 may be connected to the second electrode of the N5 transistor N5, a first electrode of the N7 transistor N7 may be connected to the high potential power line VDD, and the second electrode of the N7 transistor N7 may be connected to the first electrode of the N6 transistor N6 and the output terminal OUT of the inverter. A line connected to the gate electrode of the N7 transistor N7 is defined as a third net NET3.

When a signal corresponding to a logic high is supplied to the input terminal IN of the inverter shown in FIG. 5, the N2, N4, and N6 transistors N2, N4, N6 may be turned on. In this instance, the low potential power supplied through the low potential power line VSS may be output through the turned-on N6 transistor N6. Hence, in response to the signal corresponding to the logic high being supplied to the input terminal IN of the inverter, a signal corresponding to a logic low opposite the logic high may be output to the output terminal OUT of the inverter.

On the contrary, when a signal corresponding to the logic low is supplied to the input terminal IN of the inverter shown in FIG. 5, the N2, N4, and N6 transistors N2, N4, N6 may be turned off, and the N1, N3, N5, and N7 transistors N1, N3, N5, N7 may be turned on. In this instance, the high potential power supplied through the high potential power line VDD is output through the turned-on N7 transistor N7. Hence, when the signal corresponding to the logic low is supplied to the input terminal IN of the inverter, a signal corresponding to the logic high opposite the logic low may be output to the output terminal OUT of the inverter.

The first capacitor C1 may maintain a voltage of the gate electrode of the N3 transistor N3. When the N3 transistor N3 is turned on, a voltage of a node of the N5 transistor N5 may increase. Hence, the N5 transistor N5 may be turned on, and a positive feedback may be generated in the N5 transistor N5. Further, a node of the N7 transistor N7 may be bootstrapped by the first capacitor C1. Therefore, a charge of the output terminal OUT of the inverter shown in FIG. 5 may be performed more smoothly.

Figure 6:
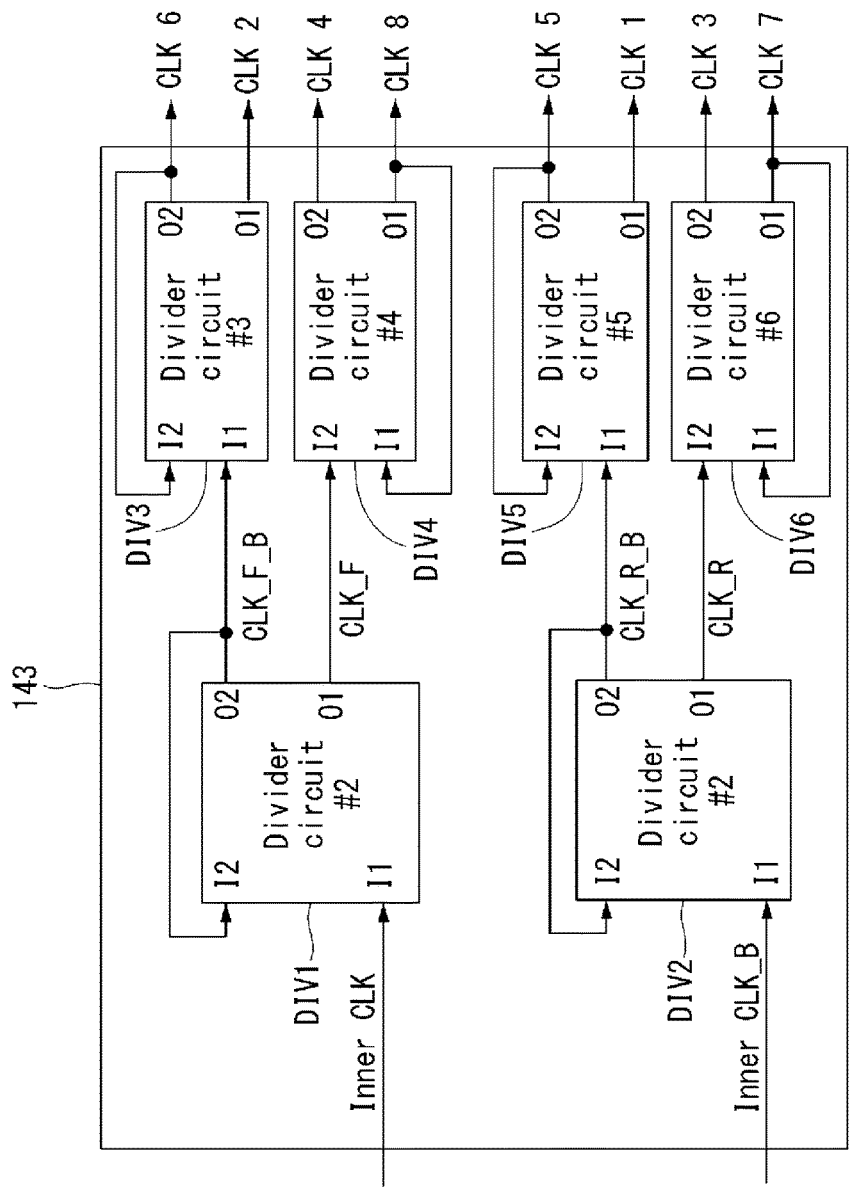
FIG. 6 is a block diagram showing in detail a clock signal generating circuit shown in FIG. 3.
Figure 7:
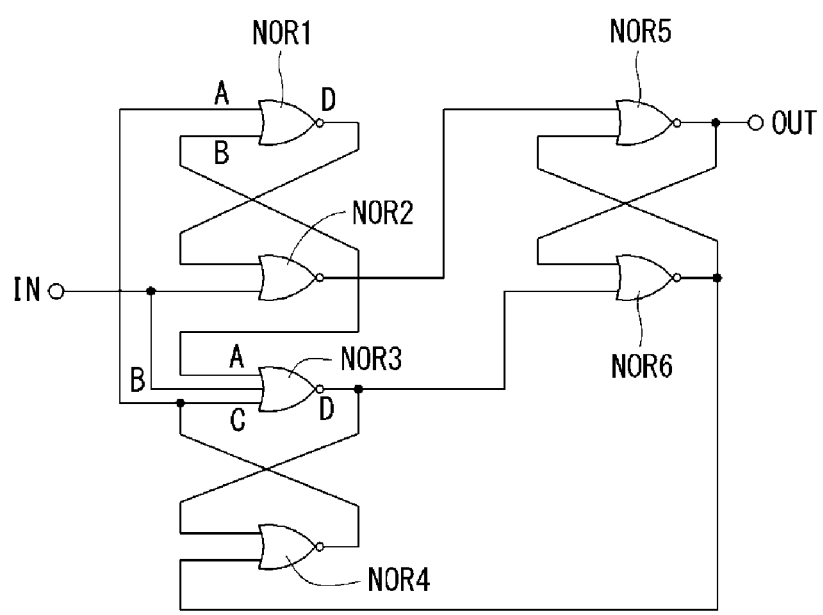
FIG. 7 shows configuration of a logic circuit with respect to a divider circuit shown in FIG. 6.
Figure 8:
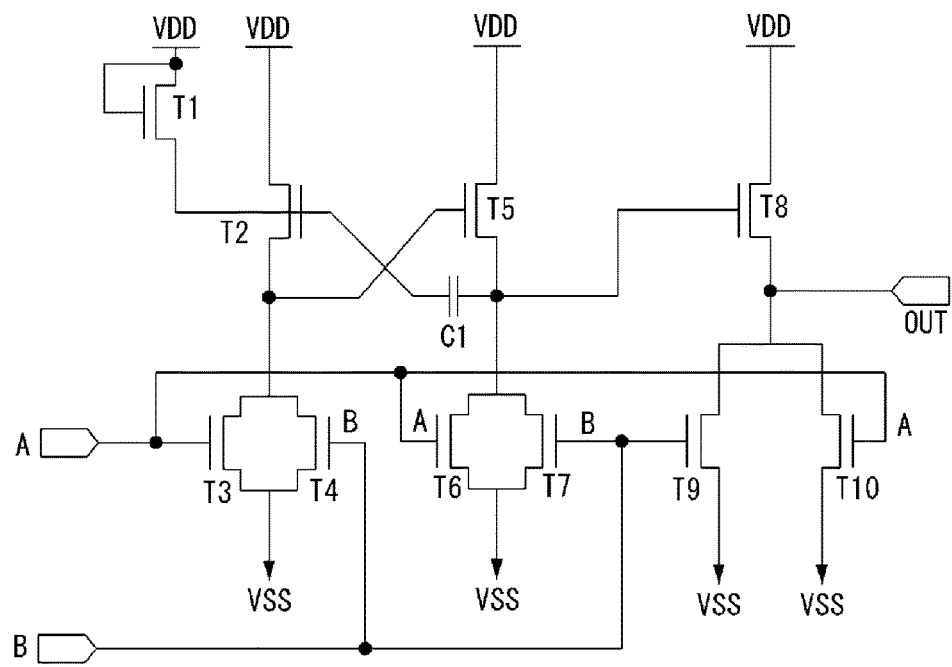
FIG. 8 shows in detail configuration of a NOR circuit shown in FIG. 7.
Figure 9:
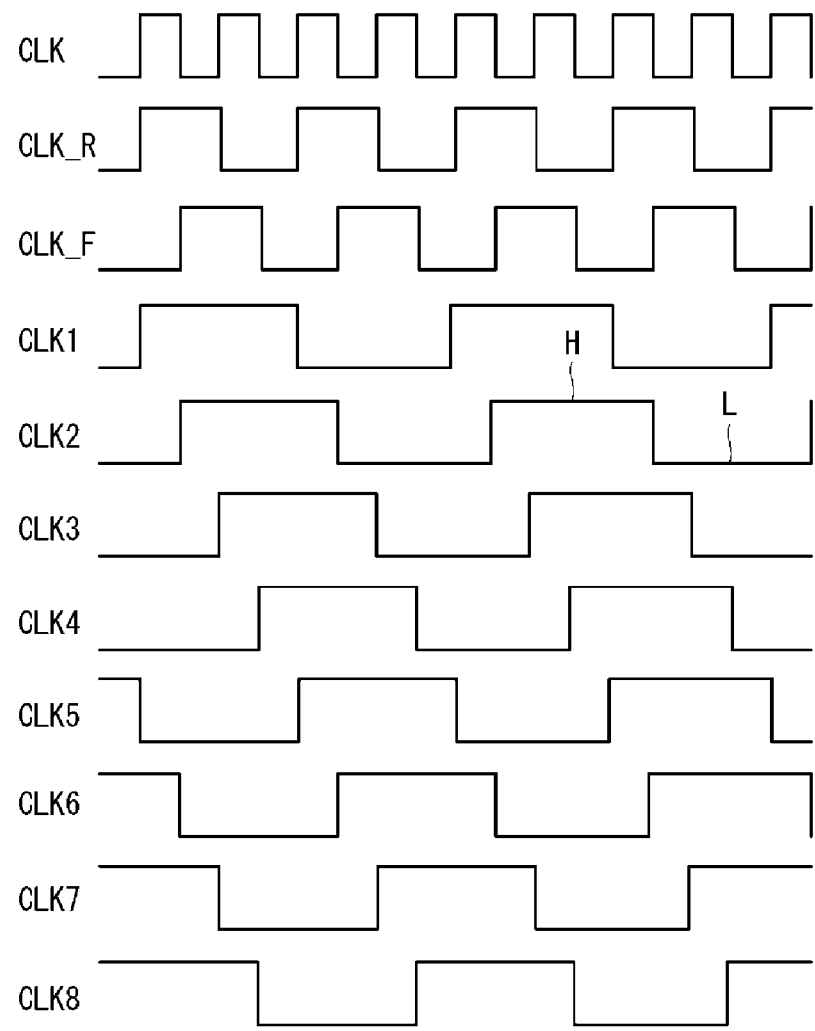
FIG. 9 is a waveform diagram of an output simulation of clock signals generated from a clock signal generating circuit shown in FIG. 6.

FIG. 6 is a block diagram showing in detail the clock signal generating circuit shown in FIG. 3. FIG. 7 shows configuration of a logic circuit with respect to a divider circuit shown in FIG. 6. FIG. 8 shows in detail configuration of a NOR circuit shown in FIG. 7. FIG. 9 is a waveform diagram of an output simulation of clock signals generated from the clock signal generating circuit shown in FIG. 6.

As shown in the FIG. 6 example, the clock signal generating circuit 143 may include an input terminal to which two clock signals of an internal clock signal Inner CLK and an internal inversion clock signal Inner CLK_B may be input, and first to eighth output terminals which may divide the two clock signals Inner CLK and Inner CLK_B, and may output first to eighth clock signals CLK1 to CLK8.

The clock signal generating circuit 143 may include at least six divider circuits DIV1 to DIV6. Each of the divider circuits DIV1 to DIV6 may include first and second input terminals I1 and I2 receiving a signal, and first and second output terminals O1 and O2 outputting a signal.

The first divider circuit DIV1, the third divider circuit DIV3, and the fourth divider circuit DIV4 may divide the internal clock signal Inner CLK, and may output the second, fourth, sixth, and eighth clock signals CLK2, CLK4, CLK6, CLK8. In general, one divider circuit may divide one input signal into two output signals, and may output the two output signals. Therefore, the third divider circuit DIV3 and the fourth divider circuit DIV4 respectively receiving first and second divider signals CLK_F and CLK_F_B output from the first divider circuit DIV1 may generate four clock signals, based on the first and second divider signals CLK_F and CLK_F_B. Hence, the third divider circuit DIV3 and the fourth divider circuit DIV4 may output the second, fourth, sixth, and eighth clock signals CLK2, CLK4, CLK6, CLK8.

The second divider circuit DIV2, the fifth divider circuit DIV5, and the sixth divider circuit DIV6 may divide the internal inversion clock signal Inner CLK_B, and may output the first, third, fifth, and seventh clock signals CLK1, CLK3, CLK5, CLK7. In general, one divider circuit may divide one input signal into two output signals, and may output the two output signals. Therefore, the fifth divider circuit DIV5 and the sixth divider circuit DIV6 respectively receiving third and fourth divider signals CLK_R and CLK_R_B output from the second divider circuit DIV2 may generate four clock signals, based on the third and fourth divider signals CLK_R and CLK_R_B. Hence, the fifth divider circuit DIV5 and the sixth divider circuit DIV6 may output the first, third, fifth, and seventh clock signals CLK1, CLK3, CLK5, CLK7. Each of the first to sixth divider circuits DIV1 to DIV6 may feed back a signal output from the second output terminal O2 to the second input terminal I2, and may generate an output signal, based on a signal input from the first and second input terminals I1 and I2.

As shown in the FIG. 7 example, each divider circuit may include a T flip-flop including six NOR circuits NOR1 to NOR6. The NOR circuit implements OR operation on signals supplied through input terminals, and then inverts an obtained value. The NOR circuit outputs the inverted value through its output terminal.

A first input terminal A of the first NOR circuit NOR1 may be connected to a third input terminal C of the third NOR circuit NOR3, a second input terminal B of the first NOR circuit NOR1 may be connected to a first input terminal A of the third NOR circuit NOR3, and an output terminal D of the first NOR circuit NOR1 may be connected to a first input terminal A of the second NOR circuit NOR2. The first input terminal A of the second NOR circuit NOR2 may be connected to the output terminal D of the first NOR circuit NOR1, a second input terminal B of the second NOR circuit NOR2 may be connected to an input terminal IN of the divider circuit, and an output terminal D of the second NOR circuit NOR2 may be connected to a first input terminal A of the fifth NOR circuit NOR5.

The first input terminal A of the third NOR circuit NOR3 may be connected to the second input terminal B of the first NOR circuit NOR1, a second input terminal B of the third NOR circuit NOR3 may be connected to the input terminal IN of the divider circuit, the third input terminal C of the third NOR circuit NOR3 may be connected to the first input terminal A of the first NOR circuit NOR1, and an output terminal D of the third NOR circuit NOR3 may be connected to a second input terminal B of the sixth NOR circuit NOR6.

A first input terminal A of the fourth NOR circuit NOR4 may be connected to the output terminal D of the third NOR circuit NOR3, a second input terminal B of the fourth NOR circuit NOR4 may be connected to an output terminal D of the sixth NOR circuit NOR6, and an output terminal D of the fourth NOR circuit NOR4 may be connected to the third input terminal C of the third NOR circuit NOR3. The first input terminal A of the fifth NOR circuit NOR5 may be connected to the output terminal D of the second NOR circuit NOR2, a second input terminal B of the fifth NOR circuit NOR5 may be connected to the output terminal D of the sixth NOR circuit NOR6, and an output terminal D of the fifth NOR circuit NOR5 may be connected to an output terminal OUT of the divider circuit.

A first input terminal A of the sixth NOR circuit NOR6 may be connected to the output terminal D of the fifth NOR circuit NOR5, the second input terminal B of the sixth NOR circuit NOR6 may be connected to the output terminal D of the third NOR circuit NOR3, and the output terminal D of the sixth NOR circuit NOR6 may be connected to the second input terminal B of the fifth NOR circuit NOR5.

As shown in the FIG. 8 example, each NOR circuit may include transistors T1 to T10 and a first capacitor C1. A gate electrode and a first electrode of the T1 transistor T1 may be connected to a high potential power line VDD, and a second electrode of the T1 transistor T1 may be connected to a gate electrode of the T3 transistor T3.

A gate electrode of the T2 transistor T2 may be connected to the second electrode of the T1 transistor T1, a first electrode of the T2 transistor T2 may be connected to the high potential power line VDD, and a second electrode of the T2 transistor T2 may be commonly connected to first electrodes of the T3 transistor T3 and the T4 transistor T4. A gate electrode of the T3 transistor T3 may be connected to a first input terminal A of the NOR circuit, the first electrode of the T3 transistor T3 may be connected to the first electrode of the T4 transistor T4, and a second electrode of the T3 transistor T3 may be commonly connected to a second electrode of the T4 transistor T4 and a low potential power line VSS.

A gate electrode of the T4 transistor T4 may be connected to a second input terminal B of the NOR circuit, the first electrode of the T4 transistor T4 may be connected to the first electrode of the T3 transistor T3, and the second electrode of the T4 transistor T4 may be commonly connected to the second electrode of the T3 transistor T3 and the low potential power line VSS. A gate electrode of the T5 transistor T5 may be connected to the second electrode of the T2 transistor T2, a first electrode of the T5 transistor T5 may be connected to the high potential power line VDD, and a second electrode of the T5 transistor T5 may be commonly connected to first electrodes of the T6 transistor T6 and the T7 transistor T7.

One end of the first capacitor C1 may be connected to the second electrode of the T1 transistor T1 and the gate electrode of the T2 transistor T2. The other end the first capacitor C1 may be connected to the second electrode of the T5 transistor T5 and a gate electrode of the T8 transistor T8.

A gate electrode of the T6 transistor T6 may be connected to the first input terminal A of the NOR circuit, a first electrode of the T6 transistor T6 may be connected to a first electrode of the T7 transistor T7, and a second electrode of the T6 transistor T6 may be commonly connected to a second electrode of the T7 transistor T7 and the low potential power line VSS. A gate electrode of the T7 transistor T7 may be connected to the second input terminal B of the NOR circuit, the first electrode of the T7 transistor T7 may be connected to the first electrode of the T6 transistor T6, and the second electrode of the T7 transistor T7 may be commonly connected to the second electrode of the T6 transistor T6 and the low potential power line VSS.

A gate electrode of the T8 transistor T8 may be connected to the second electrode of the T5 transistor T5, a first electrode of the T8 transistor T8 may be connected to the high potential power line VDD, and a second electrode of the T8 transistor T8 may be commonly connected to first electrodes of the T9 transistor T9 and the T10 transistor T10 and an output terminal OUT of the NOR circuit. A gate electrode of the T9 transistor T9 may be connected to the second input terminal B of the NOR circuit, the first electrode of the T9 transistor T9 may be connected to the first electrode of the T10 transistor T10, and a second electrode of the T9 transistor T9 may be connected to the low potential power line VSS. A gate electrode of the T10 transistor T10 may be connected to the first input terminal A of the NOR circuit, the first electrode of the T10 transistor T10 may be connected to the first electrode of the T9 transistor T9, and a second electrode of the T10 transistor T10 may be connected to the low potential power line VSS.

As can be seen from a comparison between the inverter of FIG. 5 and the NOR circuit of FIG. 8, the NOR circuit of FIG. 8 was configured through the application of the inverter of FIG. 5. When the N2, N4, and N6 transistors N2, N4, N6 are not turned on, each of net nodes NET1 to NET3 in the inverter of FIG. 5 may not be discharged and may continuously remain in a charged state.

In a truth table of the NOR circuit, an output may be logic high only when all of inputs are logic low. Therefore, a transistor performing a function similar or equal to the N2, N4, and N6 transistors N2, N4, N6 may be added. For example, an output may be logic high only when both of two inputs are logic low, and an output may be logic low when even one of two inputs is logic high. Therefore, the T3, T4, T6, T7, T9, and T10 transistors T3, T4, T6, T7, T9, T10 may be connected in parallel to one another, and thus may implement the NOR circuit.

FIG. 9 shows that one clock signal CLK may be generated as a plurality of clock signals CLK1 to CLK8 using the inverter 141 and the clock signal generating circuit 143 according to an embodiment. In the FIG. 9 example, CLK_F and CLK_R may be divider signals output through output terminals of the first and second divider circuits DIV1 and DIV2. As described above, when the inverter 141 and the clock signal generating circuit 143 are formed in the display panel, a circuit formed outside the display panel may be simplified.

Figure 10:
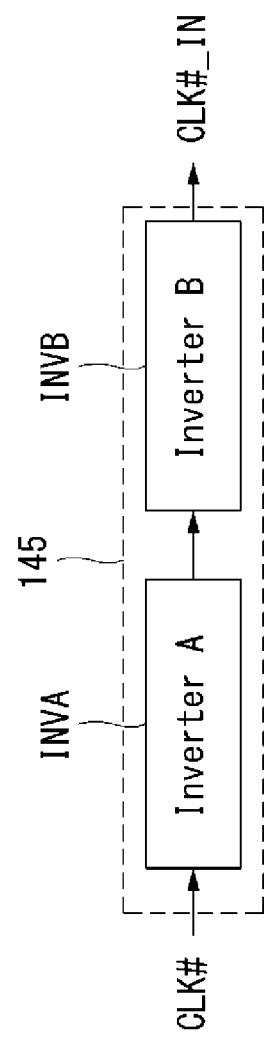
FIG. 10 is a block diagram of a buffer according to an embodiment.
Figure 11:
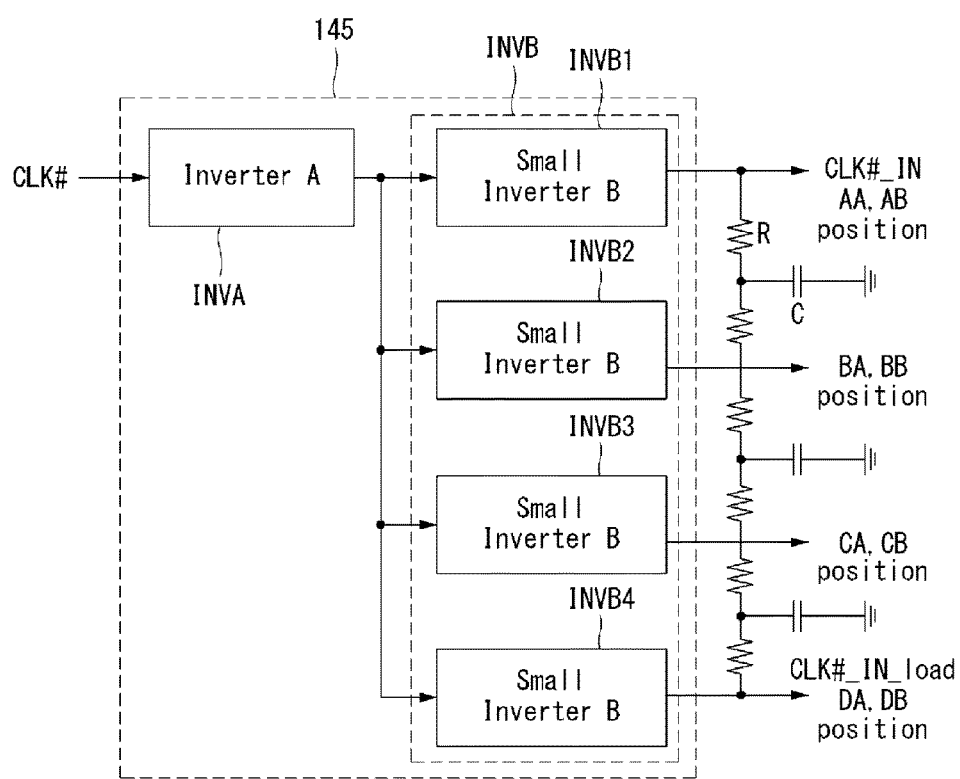
FIG. 11 is a block diagram showing in detail a buffer shown in FIG. 10.
Figure 12:
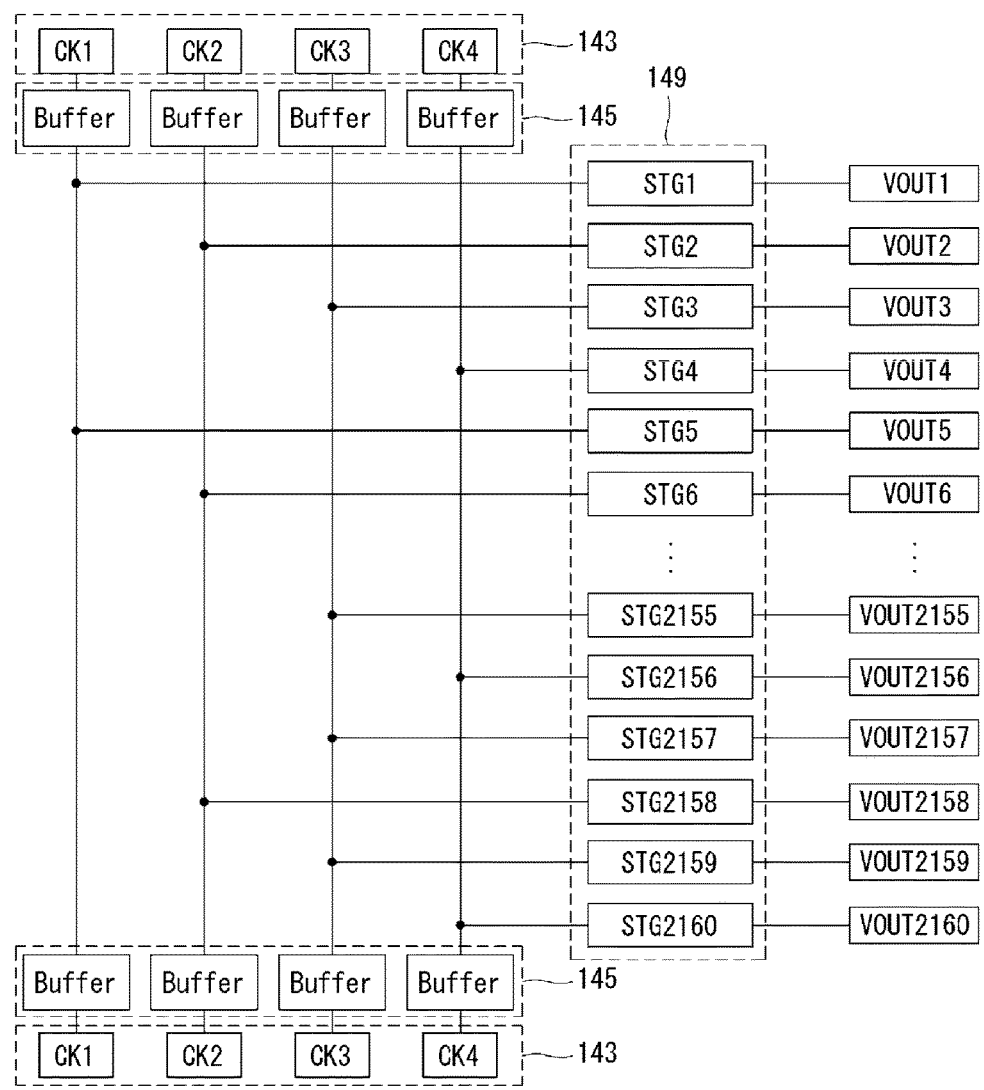
FIG. 12 is a block diagram showing a disposition of a clock signal generating circuit and a buffer according to a related art.
Figure 13:
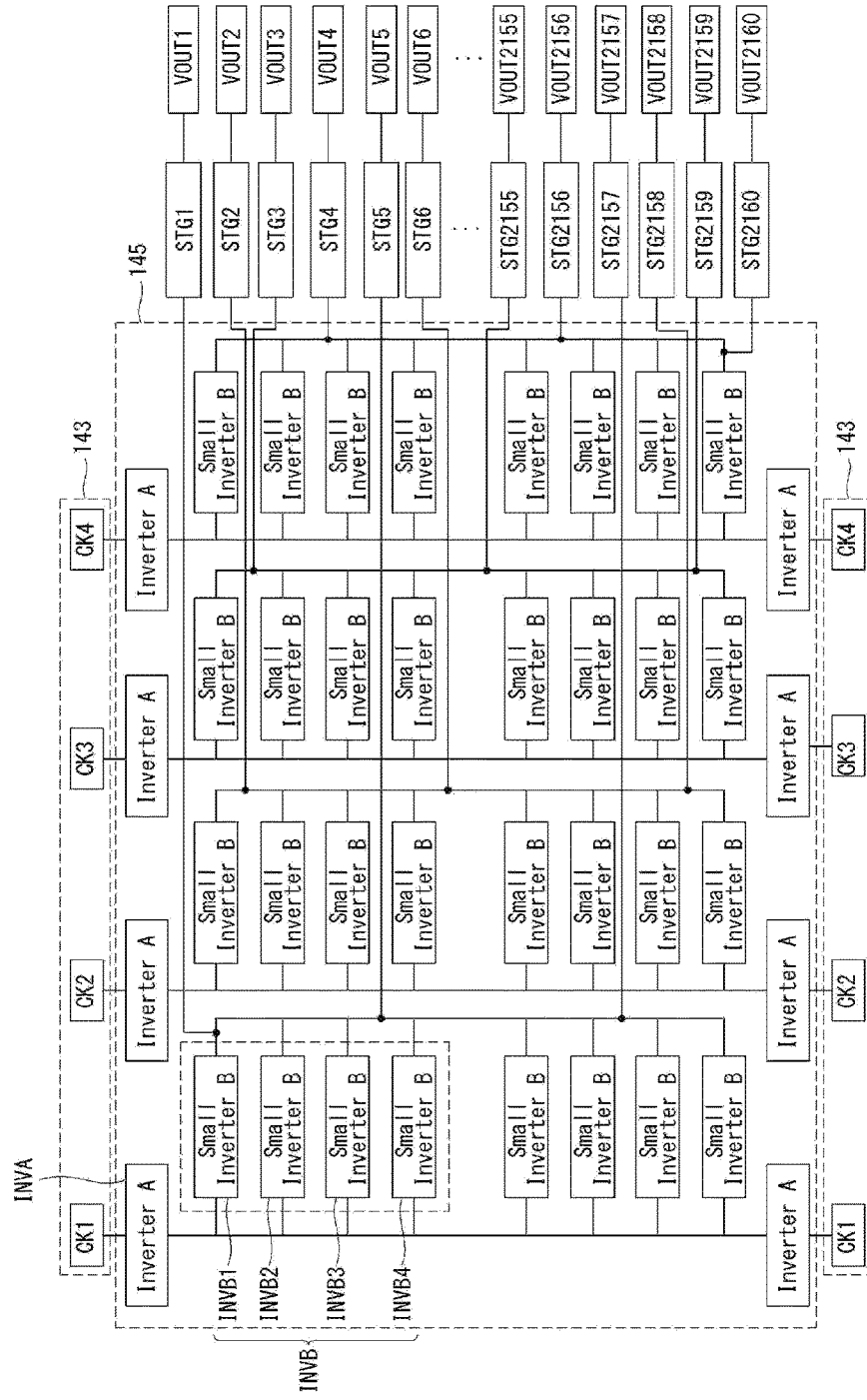
FIG. 13 is a block diagram showing a disposition of a clock signal generating circuit and a buffer according to an embodiment.
Figure 14:
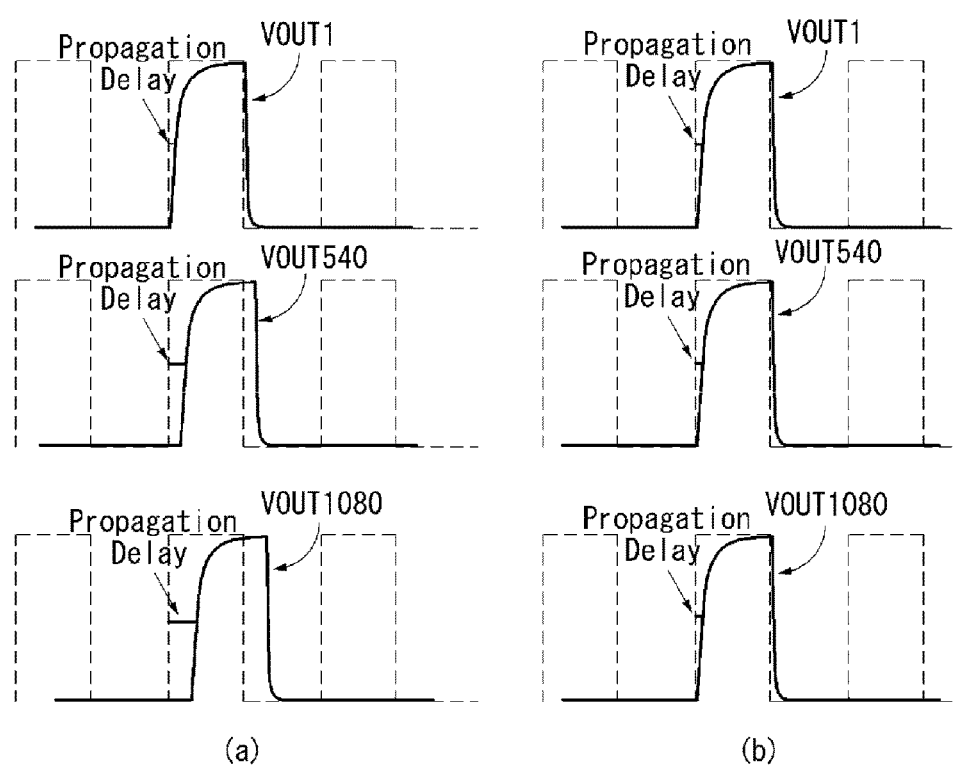
FIG. 14 is a waveform diagram showing a comparison between the related art and an embodiment with respect to a propagation delay of an output terminal of a scan driver.

FIG. 10 is a block diagram of a buffer according to an embodiment. FIG. 11 is a block diagram showing in detail the buffer shown in FIG. 10. FIG. 12 is a block diagram showing a disposition of a clock signal generating circuit and a buffer according to a related art. FIG. 13 is a block diagram showing a disposition of a clock signal generating circuit and a buffer according to an embodiment. FIG. 14 is a waveform diagram showing a comparison between the related art and the embodiment of the invention with respect to a propagation delay of an output terminal of a scan driver.

The buffer 145 of FIG. 3 may transmit eight clock signals CLK1 to CLK8, each having a different phase output from the clock signal generating circuit 143, to stages STG1 to STGn of the shift register 149. As shown in FIG. 10, the buffer 145 according to an embodiment may include two inverters INVA and INVB. The buffer 145 may delay clock signals CLK# output from the clock signal generating circuit 143, and may outputs delayed clock signals CLK#_IN. The buffer 145 may be implemented such that the two inverters INVA and INVB may delay one clock signal (for example, CLK1) and output it.

When the buffer 145 is directly formed on the display panel, a propagation delay resulting from a load of the clock signal may be generated in an upper portion and a middle portion of the display panel. The data signals output through the data lines may be input for a predetermined period of time, and the propagation delay may be generated by the load of the clock signal. Hence, a signal difference may be generated.

One of the two inverters INVA and INVB of the buffer 145 according to an embodiment may be implemented as a multi-buffer to reduce the signal difference. The multi-buffer may be differently positioned, depending on an area of the display panel.

As shown in the FIG. 11 example, the second inverter INVB among the two inverters INVA and INVB of the buffer 145 according to an embodiment may be implemented as a multi-buffer. The second inverter INVB implemented as the multi-buffer may be divided into a plurality of inverters, and the plurality of inverters may be connected in parallel to one another. The number of inverters divided from the second inverter INVB implemented as the multi-buffer may increase, as the circuit configuration of the second inverter INVB is smaller and simpler than the first inverter INVA.

For example, the second inverter INVB may include first to fourth small inverters INVB1 to INVB4. The first small inverter INVB1 may be formed at first positions AA and AB (or at one side and the other side of an $n^{th}$ line) of the display panel. The second small inverter INVB2 may be formed at second positions BA and BB (or at one side and the other side of an $(n+i)^{th}$ line) of the display panel. The third small inverter INVB3 may be formed at third positions CA and CB (or at one side and the other side of an $(n+j)^{th}$ line) of the display panel. The fourth small inverter INVB4 may be formed at fourth positions DA and DB (or at one side and the other side of an $(n+k)^{th}$ line) of the display panel.

In an embodiment, in an example using a single buffer, the position AA of the display panel may be referred to as a best case, and the position DB of the display panel may be referred to as a worst case. The positions of the display panel divided based on the line may be divided based on a load of the clock signal, and the positions of the display panel divided based on the column may be divided based on a load of the scan signal.

As shown in FIG. 12, a related art clock signal generating circuit 143 and a related art buffer 145 are positioned adjacent to each other in the non-display area of the display panel. The clock signal generating circuit 143 outputs clock signals at both ends constituting the upper and lower sides of the display panel. The buffer 145 delays the clock signals at both ends of the display panel and then transmits the clock signals to the shift register 149.

In the related art, the clock signal is supplied from one position, and the buffer 145 transmits the clock signal from one position to the shift register 149. Therefore, the propagation delay is generated depending on the area of the display panel.

In this instance, rising time points and falling time points of the clock signals differently move depending on a position or an area. Because the shift register 149 receives the clock signals each having a different rising time point and a different falling time point depending on a position, a deviation of a charging time is generated. Hence, the image quality and the display quality of the related art may be reduced.

As shown in the FIG. 13 example, the buffer 145 according to an embodiment may uniformly distribute the small inverters of the multi-buffer (e.g., the second inverter) INVB, which may be connected in parallel to one another, in the non-display area of the display panel in consideration of the load of the clock signal or the load of the scan signal.

The clock signal generating circuit 143 may output the clock signals at both ends constituting the upper and lower sides of the display panel. However, the buffer 145 may delay the clock signals at positions corresponding to stages STG1 to STG2160, and then may transmit the clock signals to the shift register 149.

As described above, the second inverter INVB implemented as the multi-buffer according to an embodiment may be distributed at a specific position of the display panel in consideration of the load of the clock signal. Hence, the propagation delay of the related art may be improved and prevented.

FIG. 14 shows simulation results of a structure according to the related art and a structure according to an embodiment of the invention with respect to the propagation delay of the output terminal of the scan driver.

As shown in part (a) of FIG. 14, in the structure according to the related art, there is the propagation delay between a first scan signal VOUT1 output from an output terminal of a first stage, a $540^{th}$ scan signal VOUT540 output from an output terminal of a $540^{th}$ stage, and a $1080^{th}$ scan signal VOUT1080 output from an output terminal of a $1080^{th}$ stage.

On the other hand, as shown in part (b) of FIG. 14, in the structure according to an embodiment, there is little propagation delay between a first scan signal VOUT1 output from an output terminal of a first stage, a $540^{th}$ scan signal VOUT540 output from an output terminal of a $540^{th}$ stage, and a $1080^{th}$ scan signal VOUT1080 output from an output terminal of a $1080^{th}$ stage. For example, because embodiments may distribute the buffer using the multi-buffer circuit depending on the load of the clock signal of the display panel, the propagation delay between the scan signals may be improved and prevented.

Figure 15:
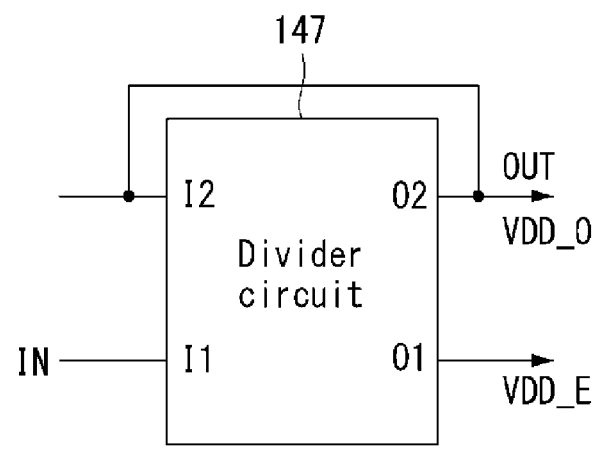
FIG. 15 is a block diagram of a divider circuit included in a power control circuit shown in FIG. 3.
Figure 16:
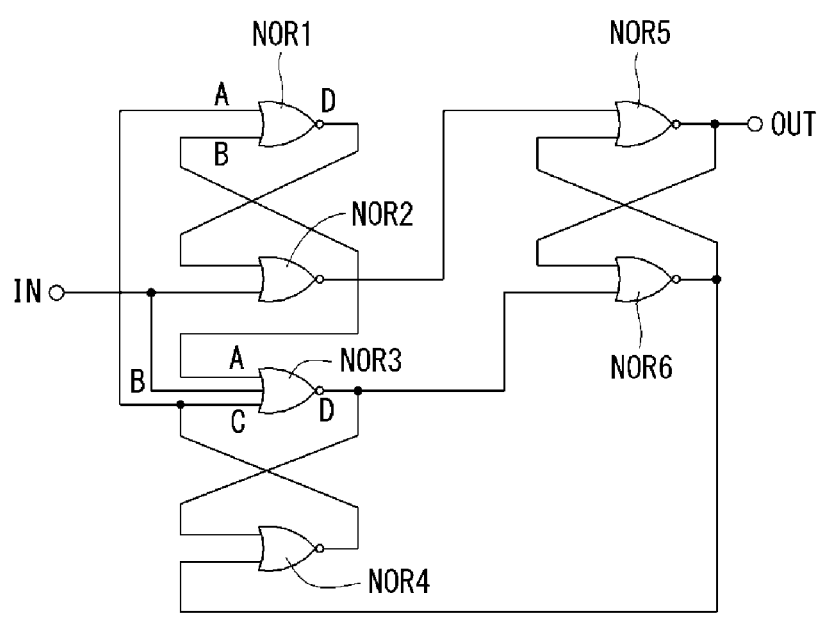
FIG. 16 shows configuration of a logic circuit with respect to a divider circuit shown in FIG. 15.
Figure 17:
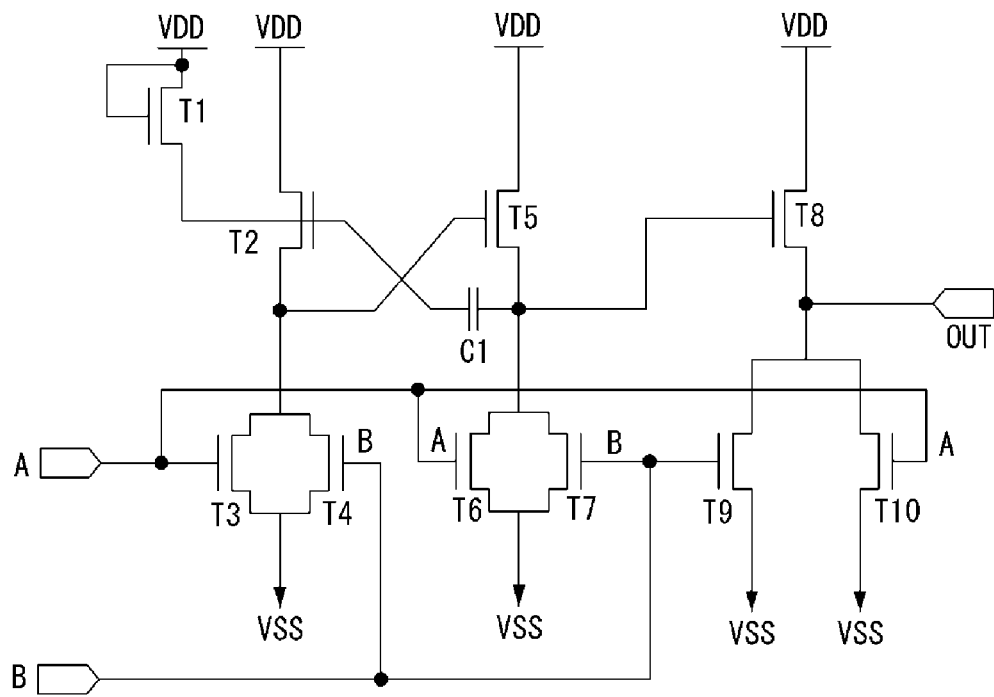
FIG. 17 shows a detailed configuration of a first NOR circuit shown in FIG. 16.
Figure 18:
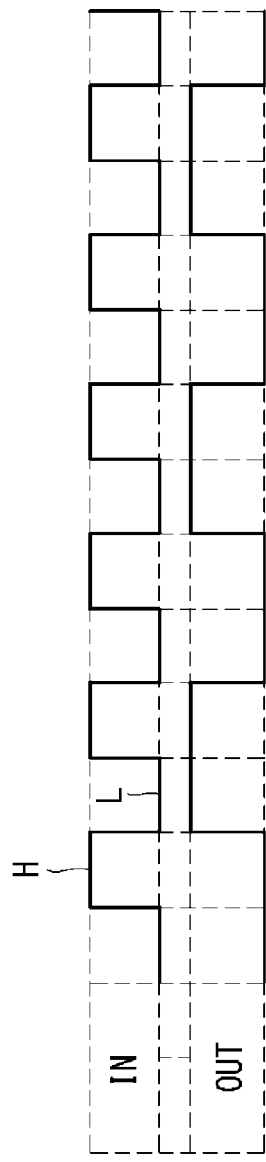
FIG. 18 is a waveform diagram showing input and output signals of a divider circuit shown in FIG. 15.
Figure 19:
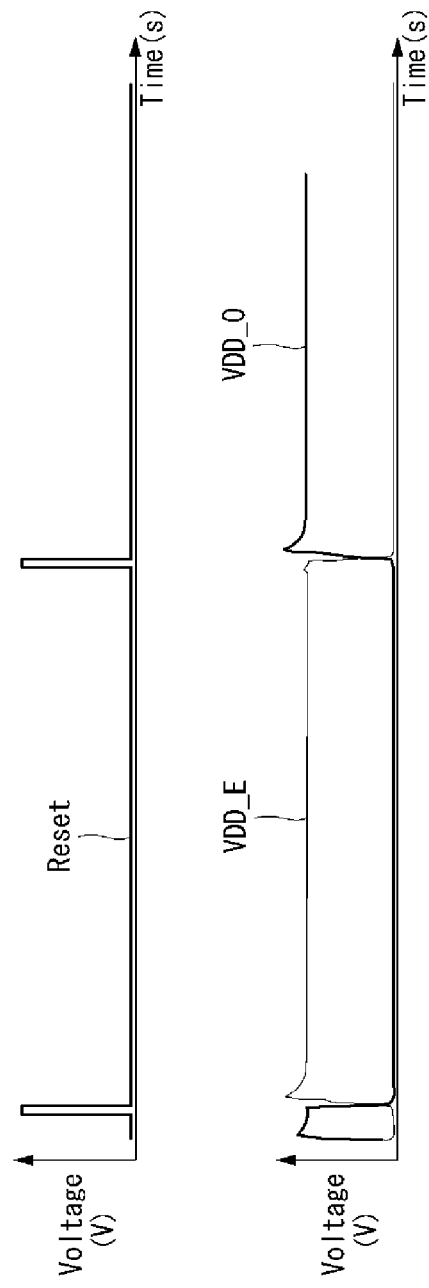
FIG. 19 is a waveform diagram of an output simulation of first and second high potential powers generated from a power control circuit.
Figure 20:
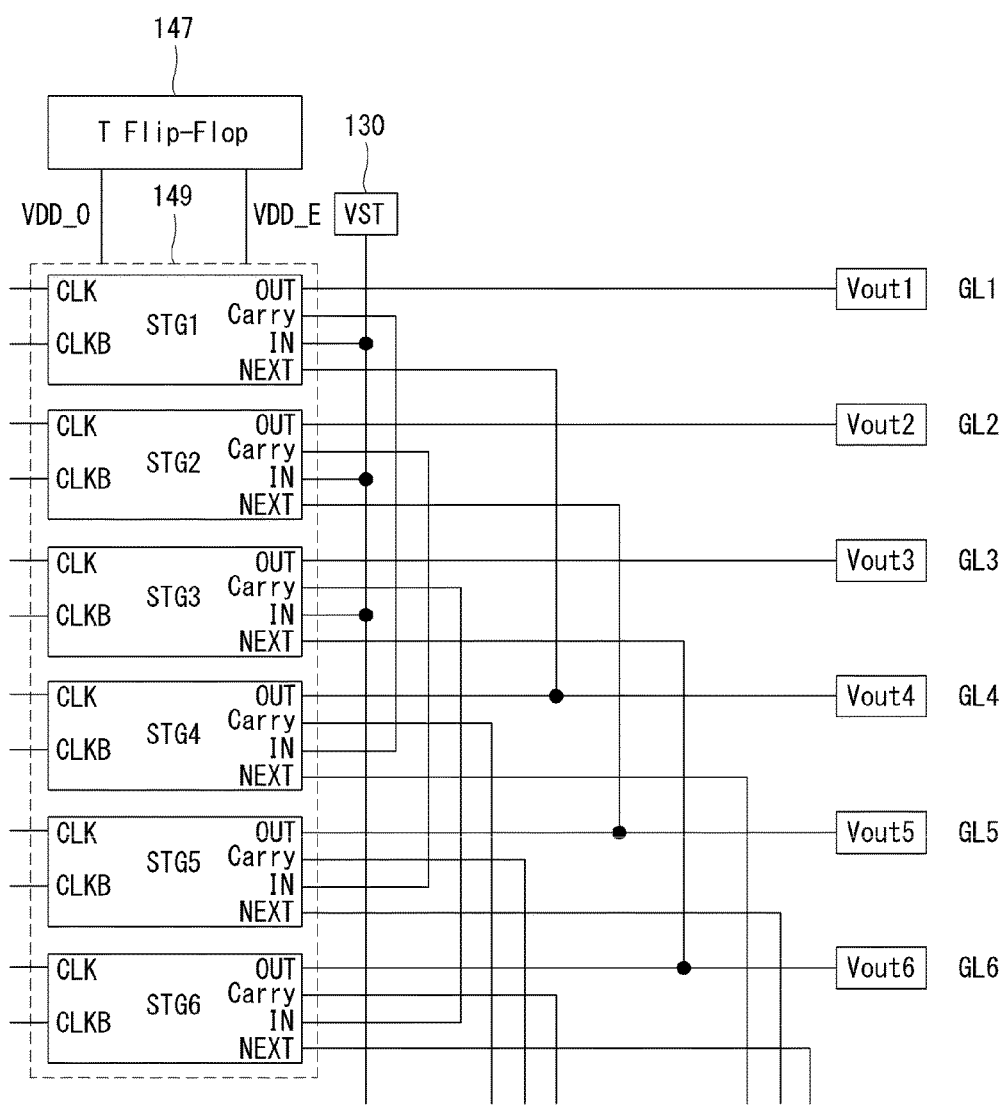
FIG. 20 is a block diagram of a shift register, to which a power control circuit shown in FIG. 19 is applied.

FIG. 15 is a block diagram of a divider circuit included in the power control circuit shown in FIG. 3. FIG. 16 shows configuration of a logic circuit with respect to the divider circuit shown in FIG. 15. FIG. 17 shows in detail configuration of a first NOR circuit shown in FIG. 16. FIG. 18 is a waveform diagram showing input and output signals of the divider circuit shown in FIG. 15. FIG. 19 is a waveform diagram of an output simulation of first and second high potential powers generated from the power control circuit. FIG. 20 is a block diagram of the shift register, to which the power control circuit shown in FIG. 19 is applied.

The shift register 149 of FIG. 3 may outputs the scan signal to first to $n^{th}$ scan lines GL1 to GLn in response to various signals output from the level shifter 130. The transistors included in the shift register 149 may have a condition of "threshold voltage Vth<0" in a depletion mode.

Because of this, even when gate-to-source voltages Vgs of the transistors constituting the shift register 149 are 0V, the transistors are not completely turned off and a leakage current may flow. For example, because the transistors are not turned off and the leakage current is generated, a malfunction may be generated in the output terminals of the transistors. In this instance, the transistors can be completely turned off by setting a condition of "the gate-to-source voltages Vgs of the transistors<0" when implementing the circuit.

For this, in recent times, various methods using two QB nodes (including a structure sharing the two QB nodes), two pull-down transistors, and two high potential powers have been proposed and introduced, so that the QB node existing inside the shift register, when included in the shift register, can be AC (alternating current) driven.

The above-described example shows the structure for reducing a stress of the pull-down transistor of the shift register. In the structure, two high potential powers may be dividedly supplied into an odd high potential power and an even high potential power, to reduce the stress of the pull-down transistor of the shift register. The odd high potential power and the even high potential power (e.g., the logic high and the logic low) may be alternately supplied every at least one frame.

Hereinafter, an embodiment may implement the power control circuit controlling the odd high potential power and the even high potential power as the divider circuit, and may form the divider circuit on the display panel through the GIP method. As shown in the FIG. 15 example, the power control circuit 147 according to an embodiment may include a divider circuit having two input terminals I1 and I2 and two output terminals O1 and O2.

As shown in the FIG. 16 example, a divider circuit may include a T flip-flop including six NOR circuits NOR1 to NOR6. The NOR circuit implements an OR operation on signals supplied through input terminals and then inverts an obtained value. The NOR circuit outputs the inverted value through its output terminal.

A first input terminal A of the first NOR circuit NOR1 may be connected to a third input terminal C of the third NOR circuit NOR3, a second input terminal B of the first NOR circuit NOR1 may be connected to a first input terminal A of the third NOR circuit NOR3, and an output terminal D of the first NOR circuit NOR1 may be connected to a first input terminal A of the second NOR circuit NOR2. The first input terminal A of the second NOR circuit NOR2 may be connected to the output terminal D of the first NOR circuit NOR1, a second input terminal B of the second NOR circuit NOR2 may be connected to an input terminal IN of the divider circuit, and an output terminal D of the second NOR circuit NOR2 may be connected to a first input terminal A of the fifth NOR circuit NOR5.

The first input terminal A of the third NOR circuit NOR3 may be connected to the second input terminal B of the first NOR circuit NOR1, a second input terminal B of the third NOR circuit NOR3 may be connected to the input terminal IN of the divider circuit, the third input terminal C of the third NOR circuit NOR3 may be connected to the first input terminal A of the first NOR circuit NOR1, and an output terminal D of the third NOR circuit NOR3 may be connected to a second input terminal B of the sixth NOR circuit NOR6. A first input terminal A of the fourth NOR circuit NOR4 may be connected to the output terminal D of the third NOR circuit NOR3, a second input terminal B of the fourth NOR circuit NOR4 may be connected to an output terminal D of the sixth NOR circuit NOR6, and an output terminal D of the fourth NOR circuit NOR4 may be connected to the third input terminal C of the third NOR circuit NOR3.

The first input terminal A of the fifth NOR circuit NOR5 may be connected to the output terminal D of the second NOR circuit NOR2, a second input terminal B of the fifth NOR circuit NOR5 may be connected to the output terminal D of the sixth NOR circuit NOR6, and an output terminal D of the fifth NOR circuit NOR5 may be connected to an output terminal OUT of the divider circuit. A first input terminal A of the sixth NOR circuit NOR6 may be connected to the output terminal D of the fifth NOR circuit NOR5, the second input terminal B of the sixth NOR circuit NOR6 may be connected to the output terminal D of the third NOR circuit NOR3, and the output terminal D of the sixth NOR circuit NOR6 may be connected to the second input terminal B of the fifth NOR circuit NOR5.

As shown in the FIG. 17 example, each NOR circuit may include transistors T1 to T10 and a first capacitor C1. A gate electrode and a first electrode of the T1 transistor T1 may be connected to a high potential power line VDD, and a second electrode of the T1 transistor T1 may be connected to a gate electrode of the T3 transistor T3.

A gate electrode of the T2 transistor T2 may be connected to the second electrode of the T1 transistor T1, a first electrode of the T2 transistor T2 may be connected to the high potential power line VDD, and a second electrode of the T2 transistor T2 may be commonly connected to first electrodes of the T3 transistor T3 and the T4 transistor T4. A gate electrode of the T3 transistor T3 may be connected to a first input terminal A of the NOR circuit, the first electrode of the T3 transistor T3 may be connected to the first electrode of the T4 transistor T4, and a second electrode of the T3 transistor T3 may be commonly connected to a second electrode of the T4 transistor T4 and a low potential power line VSS.

A gate electrode of the T4 transistor T4 may be connected to a second input terminal B of the NOR circuit, the first electrode of the T4 transistor T4 may be connected to the first electrode of the T3 transistor T3, and the second electrode of the T4 transistor T4 may be commonly connected to the second electrode of the T3 transistor T3 and the low potential power line VSS. A gate electrode of the T5 transistor T5 may be connected to the second electrode of the T2 transistor T2, a first electrode of the T5 transistor T5 may be connected to the high potential power line VDD, and a second electrode of the T5 transistor T5 may be commonly connected to first electrodes of the T6 transistor T6 and the T7 transistor T7.

One end of the first capacitor C1 may be connected to the second electrode of the T1 transistor T1 and the gate electrode of the T2 transistor T2. The other end the first capacitor C1 may be connected to the second electrode of the T5 transistor T5 and a gate electrode of the T8 transistor T8.

A gate electrode of the T6 transistor T6 may be connected to the first input terminal A of the NOR circuit, a first electrode of the T6 transistor T6 may be connected to a first electrode of the T7 transistor T7, and a second electrode of the T6 transistor T6 may be commonly connected to a second electrode of the T7 transistor T7 and the low potential power line VSS. A gate electrode of the T7 transistor T7 may be connected to the second input terminal B of the NOR circuit, the first electrode of the T7 transistor T7 may be connected to the first electrode of the T6 transistor T6, and the second electrode of the T7 transistor T7 may be commonly connected to the second electrode of the T6 transistor T6 and the low potential power line VSS.

A gate electrode of the T8 transistor T8 may be connected to the second electrode of the T5 transistor T5, a first electrode of the T8 transistor T8 may be connected to the high potential power line VDD, and a second electrode of the T8 transistor T8 may be commonly connected to first electrodes of the T9 transistor T9 and the T10 transistor T10 and an output terminal OUT of the NOR circuit. A gate electrode of the T9 transistor T9 may be connected to the second input terminal B, the first electrode of the T9 transistor T9 may be connected to the first electrode of the T10 transistor T10, and a second electrode of the T9 transistor T9 may be connected to the low potential power line VSS. A gate electrode of the T10 transistor T10 may be connected to the first input terminal A of the NOR circuit, the first electrode of the T10 transistor T10 may be connected to the first electrode of the T9 transistor T9, and a second electrode of the T10 transistor T10 may be connected to the low potential power line VSS.

As described above, the NOR circuit of FIG. 17 was configured through the application of the inverter. When the N2, N4, and N6 transistors N2, N4, N6 are not turned on, each of the net nodes NET1 to NET3 in the circuit of the inverter may not be discharged and may continuously remain in a charged state.

In a truth table of the NOR circuit, an output may be logic high only when all of inputs are logic low. Therefore, a transistor performing a function similar or equal to the N2, N4, and N6 transistors N2, N4, N6 may be added.

For example, an output may be logic high only when both of two inputs are logic low, and an output is logic low when even one of two inputs is logic high. Therefore, the T3, T4, T6, T7, T9, and T10 transistors T3, T4, T6, T7, T9, T10 are connected in parallel to one another and thus can implement the NOR circuit.

As shown in the FIG. 18 example, the divider circuit included in the power control circuit 147 according to an embodiment may switch the high potential power based on a specific signal supplied to the first input terminal I1 in each frame, and may outputs an odd high potential power VDD_O and an even high potential power VDD_E.

The specific signal may be a signal, of which a logic state is converted in each frame as in "IN" shown in FIG. 18. For example, a start signal or a reset signal may be used. The divider circuit may divide a signal IN supplied to the first input terminal I1 and may output an inverted signal to the first and second output terminals O1 and O2 of the divider circuit. For example, the divider circuit may output a signal indicated by "OUT" of FIG. 18 as the odd high potential power VDD_O, and may output the even high potential power VDD_E by inverting the odd high potential power VDD_O.

As shown in the FIG. 19 example, the odd high potential power VDD_O and the even high potential power VDD_E may be output from the high potential power VDD by forming the divider circuit included in the power control circuit 147 according to an embodiment and using the reset signal Reset.

As shown in the FIG. 20 example, the odd high potential power VDD_O and the even high potential power VDD_E output from the power control circuit 147 may be supplied to the first to sixth stages STG1 to STG6 of the shift register 149. As described above, the cost reduction and the voltage drop may be achieved through a reduction of the external circuit obtained by forming the power control circuit 147 on the display panel.

As described above with reference to FIGS. 3 to 20, embodiments may form the inverter 141, the clock signal generating circuit 143, the buffer 145, the power control circuit 147, and the shift register 149 on the display panel by the GIP method when the scan signal generating circuits 140L and 140R (e.g., not the level shifter 130) of the scan driver are implemented. Further, embodiments may improve the reliability and the lifespan of the display device by solving various problems caused by the characteristics of the circuit when the scan signal generating circuits 140L and 140R of the scan driver are formed by the GIP method. In addition, embodiments may minimize the propagation delay when the display device is implemented as a large-screen display device having a high resolution, and also may reduce the cost, the power consumption, and the size of the bezel through the reduction of the external circuit.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. A display device, comprising:
   a display panel; and
   a scan driver comprising:
   a level shifter; and
   a scan signal generating circuit configured to generate a scan signal to be supplied to the display panel based on a power and a signal supplied from the level shifter, the scan signal generating circuit comprising a buffer configured to transmit a clock signal to a stage of a shift register, the buffer comprising two inverters, one of the two inverters being included in a multi-buffer,
   wherein the scan signal generating circuit comprises a clock signal generating circuit configured to divide one clock signal supplied from the level shifter into a plurality of clock signals, and
   wherein the clock signal generating circuit is in a non-display area of the display panel.

2. The display device of claim 1, wherein:
   the two inverters respectively comprise:
   a first inverter; and
   a second inverter positioned at a subsequent stage of the first inverter;
   the multi-buffer comprises the second inverter; and
   the multi-buffer has a parallel connection structure.

3. The display device of claim 2, wherein a circuit configuration of the second inverter in the multi-buffer is smaller and simpler than the first inverter.

4. The display device of claim 2, wherein the second inverter in the multi-buffer is distributed in a non-display area of the display panel to minimize a propagation delay resulting from a load of the clock signal.

5. The display device of claim 1, wherein:
   the clock signal generating circuit comprises a plurality of divider circuits; and
   each of the plurality of divider circuits comprises a T flip-flop comprising first to sixth NOR circuits.

6. The display device of claim 5, wherein:
   a first input terminal of the first NOR circuit is connected to a third input terminal of the third NOR circuit, a second input terminal of the first NOR circuit is connected to a first input terminal of the third NOR circuit, and an output terminal of the first NOR circuit is connected to a first input terminal of the second NOR circuit;
   the first input terminal of the second NOR circuit is connected to the output terminal of the first NOR circuit, a second input terminal of the second NOR circuit is connected to an input terminal of the divider circuit, and an output terminal of the second NOR circuit is connected to a first input terminal of the fifth NOR circuit;
   the first input terminal of the third NOR circuit is connected to the second input terminal of the first NOR circuit, a second input terminal of the third NOR circuit is connected to the input terminal of the divider circuit, the third input terminal of the third NOR circuit is connected to the first input terminal of the first NOR circuit, and an output terminal of the third NOR circuit is connected to a second input terminal of the sixth NOR circuit;
   a first input terminal of the fourth NOR circuit is connected to the output terminal of the third NOR circuit, a second input terminal of the fourth NOR circuit is connected to an output terminal of the sixth NOR circuit, and an output terminal of the fourth NOR circuit is connected to the third input terminal of the third NOR circuit;

the first input terminal of the fifth NOR circuit is connected to the output terminal of the second NOR circuit, a second input terminal of the fifth NOR circuit is connected to the output terminal of the sixth NOR circuit, and an output terminal of the fifth NOR circuit is connected to an output terminal of the divider circuit; and a first input terminal of the sixth NOR circuit is connected to the output terminal of the fifth NOR circuit, the second input terminal of the sixth NOR circuit is connected to the output terminal of the third NOR circuit, and an output terminal of the sixth NOR circuit is connected to the second input terminal of the fifth NOR circuit.

7. The display device of claim 1, wherein the scan signal generating circuit further comprises an inverter in the non-display area of the display panel, the inverter being configured to:
supply the one clock signal to the clock signal generating circuit;
delay the one clock signal to output an internal clock signal; and
delay and invert the one clock signal to output an internal inverted clock signal.

8. The display device of claim 7, wherein:
the inverter comprises:
N1 to N7 transistors; and
a first capacitor;
a gate electrode and a first electrode of the N1 transistor are connected to a high potential power line, and a second electrode of the N1 transistor is connected to a gate electrode of the N3 transistor;
a gate electrode of the N2 transistor is connected to an input terminal of the inverter, a first electrode of the N2 transistor is connected to a second electrode of the N3 transistor, and a second electrode of the N2 transistor is connected to a low potential power line;
the gate electrode of the N3 transistor is connected to the second electrode of the N1 transistor, a first electrode of the N3 transistor is connected to the high potential power line, and the second electrode of the N3 transistor is connected to the first electrode of the N2 transistor;
a gate electrode of the N4 transistor is connected to the input terminal of the inverter, a first electrode of the N4 transistor is connected to a second electrode of the N5 transistor, and a second electrode of the N4 transistor is connected to the low potential power line;
a gate electrode of the N5 transistor is connected to the second electrode of the N3 transistor, a first electrode of the N5 transistor is connected to the high potential power line, and the second electrode of the N5 transistor is connected to the first electrode of the N4 transistor;
one end of the first capacitor is connected to the second electrode of the N1 transistor and the gate electrode of the N3 transistor, and the other end is connected to the second electrode of the N5 transistor and a gate electrode of the N7 transistor;
a gate electrode of the N6 transistor is connected to the input terminal of the inverter, a first electrode of the N6 transistor is connected to a second electrode of the N7 transistor and an output terminal of the inverter, and a second electrode of the N6 transistor is connected to the low potential power line; and
the gate electrode of the N7 transistor is connected to the second electrode of the N5 transistor, a first electrode of the N7 transistor is connected to the high potential power line, and the second electrode of the N7 transistor is connected to the first electrode of the N6 transistor and the output terminal of the inverter.

9. The display device of claim 1, wherein the scan signal generating circuit further comprises a power control circuit configured to:
switch a high potential power based on a signal, of which a logic state is converted in each frame; and
alternately output an odd high potential power and an even high potential power.

10. A scan driver, comprising:
a level shifter configured to output a power and a signal; and
a scan signal generating circuit configured to generate a scan signal based on the power and the signal supplied from the level shifter, the scan signal generating circuit comprising a buffer configured to transmit a clock signal to a stage of a shift register, the buffer comprising two inverters, one of the two inverters being included in a multi-buffer,
wherein the scan signal generating circuit comprises a clock signal generating circuit configured to divide one clock signal supplied from the level shifter into a plurality of clock signals, the clock signal generating circuit being in a non-display area of a display panel.

11. The scan driver of claim 10, wherein:
the two inverters respectively comprise:
a first inverter; and
a second inverter positioned at a subsequent stage of the first inverter,
the multi-buffer comprises the second inverter; and
the multi-buffer has a parallel connection structure.

12. The scan driver of claim 11, wherein a circuit configuration of the second inverter in the multi-buffer is smaller and simpler than the first inverter.

13. The scan driver of claim 11, wherein the second inverter in the multi-buffer is distributed in a non-display area of a display panel to minimize a propagation delay resulting from a load of the clock signal.

14. The scan driver of claim 10, wherein:
the clock signal generating circuit comprises a plurality of divider circuits; and
each of the plurality of divider circuits comprises a T flip-flop comprising first to sixth NOR circuits.

15. The scan driver of claim 14, wherein:
a first input terminal of the first NOR circuit is connected to a third input terminal of the third NOR circuit, a second input terminal of the first NOR circuit is connected to a first input terminal of the third NOR circuit, and an output terminal of the first NOR circuit is connected to a first input terminal of the second NOR circuit;
the first input terminal of the second NOR circuit is connected to the output terminal of the first NOR circuit, a second input terminal of the second NOR circuit is connected to an input terminal of the divider circuit, and an output terminal of the second NOR circuit is connected to a first input terminal of the fifth NOR circuit;
the first input terminal of the third NOR circuit is connected to the second input terminal of the first NOR circuit, a second input terminal of the third NOR circuit is connected to the input terminal of the divider circuit, the third input terminal of the third NOR circuit is connected to the first input terminal of the first NOR circuit, and an output terminal of the third NOR circuit is connected to a second input terminal of the sixth NOR circuit;

a first input terminal of the fourth NOR circuit is connected to the output terminal of the third NOR circuit, a second input terminal of the fourth NOR circuit is connected to an output terminal of the sixth NOR circuit, and an output terminal of the fourth NOR circuit is connected to the third input terminal of the third NOR circuit;

the first input terminal of the fifth NOR circuit is connected to the output terminal of the second NOR circuit, a second input terminal of the fifth NOR circuit is connected to the output terminal of the sixth NOR circuit, and an output terminal of the fifth NOR circuit is connected to an output terminal of the divider circuit; and a first input terminal of the sixth NOR circuit is connected to the output terminal of the fifth NOR circuit, the second input terminal of the sixth NOR circuit is connected to the output terminal of the third NOR circuit, and an output terminal of the sixth NOR circuit is connected to the second input terminal of the fifth NOR circuit.

16. The scan driver of claim 10, wherein the scan signal generating circuit further comprises an inverter in a non-display area of the display panel, the inverter being configured to:

supply the one clock signal to the clock signal generating circuit;

delay the one clock signal to output an internal clock signal; and delay and invert the one clock signal to output an internal inversion clock signal.

17. The scan driver of claim 16, wherein:

the inverter comprises N1 to N7 transistors and a first capacitor;

a gate electrode and a first electrode of the N1 transistor are connected to a high potential power line, and a second electrode of the N1 transistor is connected to a gate electrode of the N3 transistor;

a gate electrode of the N2 transistor is connected to an input terminal of the inverter, a first electrode of the N2 transistor is connected to a second electrode of the N3 transistor, and a second electrode of the N2 transistor is connected to a low potential power line;

the gate electrode of the N3 transistor is connected to the second electrode of the N1 transistor, a first electrode of the N3 transistor is connected to the high potential power line, and the second electrode of the N3 transistor is connected to the first electrode of the N2 transistor;

a gate electrode of the N4 transistor is connected to the input terminal of the inverter, a first electrode of the N4 transistor is connected to a second electrode of the N5 transistor, and a second electrode of the N4 transistor is connected to the low potential power line;

a gate electrode of the N5 transistor is connected to the second electrode of the N3 transistor, a first electrode of the N5 transistor is connected to the high potential power line, and the second electrode of the N5 transistor is connected to the first electrode of the N4 transistor;

one end of the first capacitor is connected to the second electrode of the N1 transistor and the gate electrode of the N3 transistor, and the other end is connected to the second electrode of the N5 transistor and a gate electrode of the N7 transistor;

a gate electrode of the N6 transistor is connected to the input terminal of the inverter, a first electrode of the N6 transistor is connected to a second electrode of the N7 transistor and an output terminal of the inverter, and a second electrode of the N6 transistor is connected to the low potential power line; and the gate electrode of the N7 transistor is connected to the second electrode of the N5 transistor, a first electrode of the N7 transistor is connected to the high potential power line, and the second electrode of the N7 transistor is connected to the first electrode of the N6 transistor and the output terminal of the inverter.

18. The scan driver of claim 10, wherein the scan signal generating circuit further comprises a power control circuit configured to:

switch a high potential power based on a signal, of which a logic state is converted in each frame; and alternately output an odd high potential power and an even high potential power.

19. A method of manufacturing a scan driver, comprising:

providing a level shifter configured to output a power and a signal; and providing a scan signal generating circuit configured to generate a scan signal based on the power and the signal supplied from the level shifter, the scan signal generating circuit comprising a buffer configured to transmit a clock signal to a stage of a shift register, the buffer comprising two inverters, one of the two inverters being included in a multi-buffer, wherein providing the scan signal generating circuit comprises providing a clock signal generating circuit configured to divide one clock signal supplied from the level shifter into a plurality of clock signals, and wherein the clock signal generating circuit is provided in a non-display area of the display panel.

* * * * *